(12) United States Patent
Ray et al.

(10) Patent No.: US 10,153,753 B2
(45) Date of Patent: Dec. 11, 2018

(54) DUTY CYCLE CORRECTION CIRCUIT FOR DIFFERENTIAL DRIVER

(71) Applicant: Finisar Corporation, Sunnyvale, CA (US)

(72) Inventors: Sagar Ray, San Jose, CA (US); The'Lihn Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/887,571

(22) Filed: Feb. 2, 2018

(65) Prior Publication Data

US 2018/0219534 A1    Aug. 2, 2018

Related U.S. Application Data

(60) Provisional application No. 62/453,770, filed on Feb. 2, 2017.

(51) Int. Cl.
| | |
|---|---|
| *H03K 3/017* | (2006.01) |
| *H03K 5/08* | (2006.01) |
| *H03K 5/156* | (2006.01) |

(52) U.S. Cl.
CPC .............. *H03K 3/017* (2013.01); *H03K 5/08* (2013.01); *H03K 5/1565* (2013.01)

(58) Field of Classification Search
CPC ......... H03K 3/017; H03K 5/08; H03K 5/1465
USPC ......................................... 327/175
See application file for complete search history.

(56) References Cited

U.S. PATENT DOCUMENTS

| | | | |
|---|---|---|---|
| 9,979,382 B1 * | 5/2018 | Chao ................... | H03K 5/1565 |
| 2002/0140477 A1 * | 10/2002 | Zhou ..................... | H03K 5/007 |
| | | | 327/175 |
| 2007/0159224 A1 * | 7/2007 | Dwarka ............... | H03K 5/1565 |
| | | | 327/175 |

* cited by examiner

*Primary Examiner* — Dinh T Le
(74) *Attorney, Agent, or Firm* — Maschoff Brennan (57) ABSTRACT

A driver circuit includes a differential driver and a duty cycle correction circuit. The differential driver includes differential inputs to receive a differential input signal and a first common mode input to receive a first input common mode voltage and a first differential output to output a first differential output voltage with a first output common mode voltage. The duty cycle correction circuit includes a first tunable voltage reference and a first comparison circuitry configured to generate the first input common mode voltage based on reducing a difference determined by the first comparison circuitry between a first reference voltage generated by the first tunable voltage reference and the first output common mode voltage at the first differential output of the first differential driver.

20 Claims, 5 Drawing Sheets

DUTY CYCLE CORRECTION CIRCUIT FOR DIFFERENTIAL DRIVER

CROSS-REFERENCE TO RELATED APPLICATION

A claim for benefit of priority to the Feb. 2, 2017 filing date of the U.S. Patent Provisional Application No. 62/453,770, titled DUTY CYCLE CORRECTION CIRCUIT FOR DIFFERENTIAL DRIVER (the '770 Provisional Application), is hereby made pursuant to 35 U.S.C. § 119(e). The entire disclosure of the '770 Provisional Application is hereby incorporated herein.

FIELD

Some implementations discussed herein are related to high-speed differential drivers.

BACKGROUND

Differential signals may be used to transmit high-speed data. Drivers transmitting high-speed data may exhibit variations in duty cycle based on a number of variations, including process, timing and common mode signals. Differential signals exhibiting variations in duty cycle may create waveforms that may be incorrectly interpreted upon receipt.

SUMMARY OF SOME EXAMPLE IMPLEMENTATIONS

Implementations disclosed herein relate to correcting the duty cycle of, for example, high speed/low voltage CMOS inverters that drive a high voltage output stage. The output stage, in turn, may drive a high speed/high voltage optical transmitter for electrical to optical data conversion in high speed optical communication.

In an example implementation, a driver circuit includes a differential driver and a duty cycle correction circuit. The differential driver includes differential inputs to receive a differential input signal and a first common mode input to receive a first input common mode voltage and a first differential output to output a first differential output voltage with a first output common mode voltage. The duty cycle correction circuit includes a first tunable voltage reference and a first comparison circuitry configured to generate the first input common mode voltage based on reducing a difference determined by the first comparison circuitry between a first reference voltage generated by the first tunable voltage reference and the first output common mode voltage at the first differential output of the first differential driver.

In another example implementation, a method includes receiving a differential input signal at a differential input of a first differential driver and a first input common mode voltage at a first common mode input of the first differential driver. A first differential output voltage may be generated with a first output common mode voltage at a first differential output of the first differential driver. The method further includes reducing a first difference determined by a first comparison circuitry between a first reference voltage generated by a first tunable voltage reference and the first output common mode voltage at a first differential output of the first differential driver. The first input common mode voltage may be generated based on the first difference between the first reference voltage generated by the first tunable voltage reference and the first common mode voltage at the first differential output of the first differential driver.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and, in part, will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description will be rendered by reference to specific implementations thereof, which are illustrated in the appended drawings. It is appreciated that these drawings depict only typical implementations of the invention and are, therefore, not to be considered limiting of its scope. The invention will be described and explained with additional specificity and detail through the use of the accompanying drawings in which.

DETAILED DESCRIPTION OF SOME EXAMPLE IMPLEMENTATIONS

Reference will now be made to the drawings to describe various aspects of example implementations of the invention. It is to be understood that the drawings are diagrammatic and schematic representations of such example implementations, and are not limiting of the present invention, nor are they necessarily drawn to scale.

Figure 1:
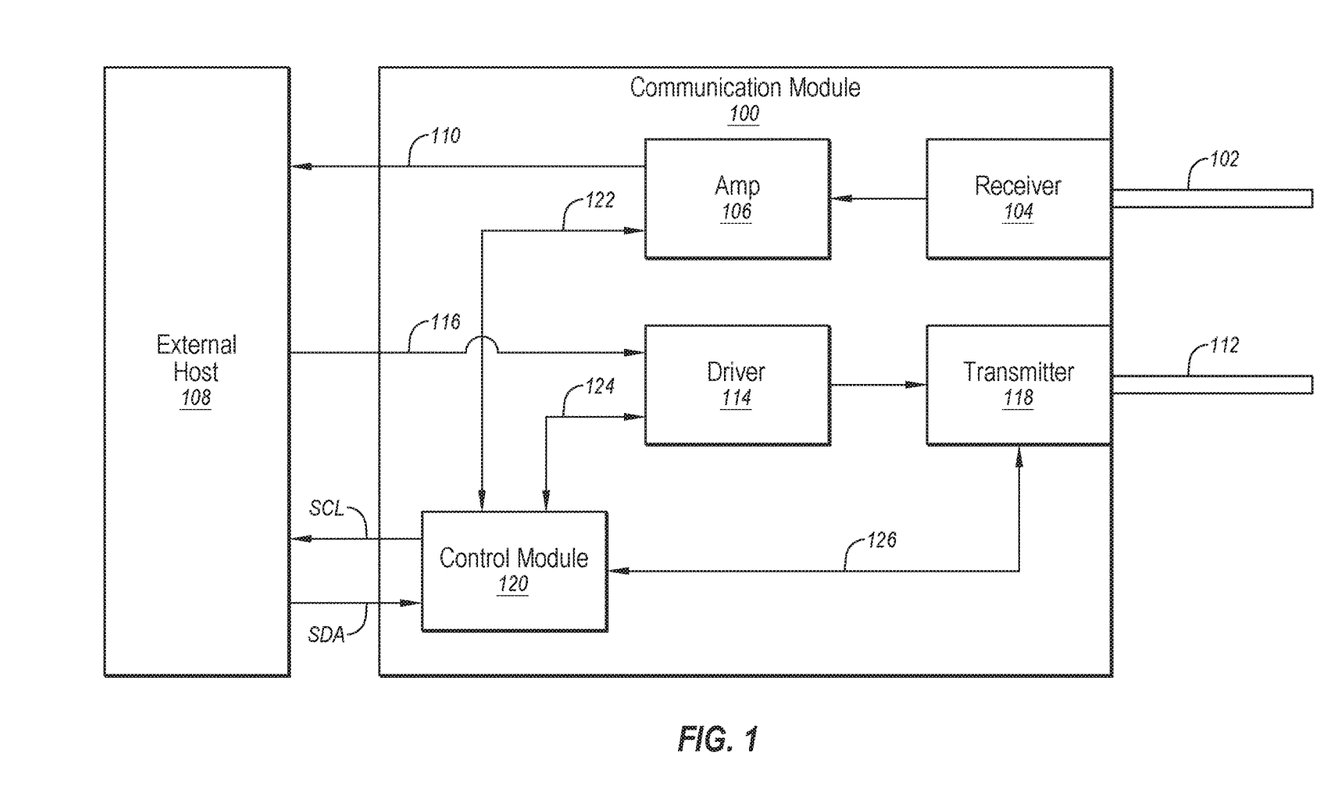
FIG. 1 illustrates an example communication module, in which some embodiments described herein may be implemented.

FIG. 1 illustrates an example communication module 100 in which some embodiments described herein may be implemented, arranged in accordance with at least one embodiment described herein. While the communication module 100 will be described in some detail, the communication module 100 is described by way of illustration only, and not by way of restricting the scope of the described embodiments.

In operation, the communication module 100 receives one or more optical signals from one or more optical fibers 102 using one or more optical receivers 104 ("Receiver" in FIG.

1). The optical receiver 104 transforms the optical signal into an electrical signal. The optical receiver 104 provides the resulting electrical signal to one or more amplifiers 106 ("Amp" in FIG. 1). The amplifier 106 amplifies the electrical signal and provides the amplified electrical signal to an external host 108 as indicated at 110. The external host 108 may be any computing system capable of communicating with the communication module 100.

The communication module 100 may also receive one or more electrical signals from the external host 108 for transmission onto one or more optical fibers 112. Specifically, one or more drivers 114 receive the electrical signal, as indicated at 116, and drive one or more optical transmitters 118 with signals that cause the optical transmitter 118 to emit onto the fiber 112 one or more optical signals representative of the information in the electrical signal provided by the external host 108. In an example embodiment described in more detail below, the driver 114 may be configured to drive the optical transmitter 118 which may be implemented as a Mach-Zehnder-Modulator (MZM).

The behavior of the optical receiver 104, the amplifier 106, the driver 114, and the optical transmitter 118 may vary dynamically due to a number of factors. For example, temperature changes, power fluctuations, and feedback conditions may each affect the performance of these components. Accordingly, the communication module 100 may include a control module 120, which may evaluate temperature and voltage conditions and other operational circumstances, and receive information from the amplifier 106 (as indicated at 122) and from the driver 114 (as indicated at 124). This allows the control module 120 to optimize the dynamically varying performance, and additionally detect when there is a loss of signal.

Specifically, the control module 120 may counteract these changes by adjusting settings on the amplifier 106 and/or the driver 114 (as also indicated at 122 and/or 124). These settings adjustments may be intermittent since they may only be made when temperature or voltage or other low frequency changes so warrant. The control module 120 may communicate with the host 108 through a communication interface such as an I²C two-wire interface, indicated in FIG. 1 as serial data (SDA) and serial clock (SCL) lines. The control module 120 may alternatively or additionally receive information to determine and reduce a difference in the driver 114 between one or more reference voltages generated by one or more tunable voltage references and common mode voltages present in the driver 114.

Figure 2A:
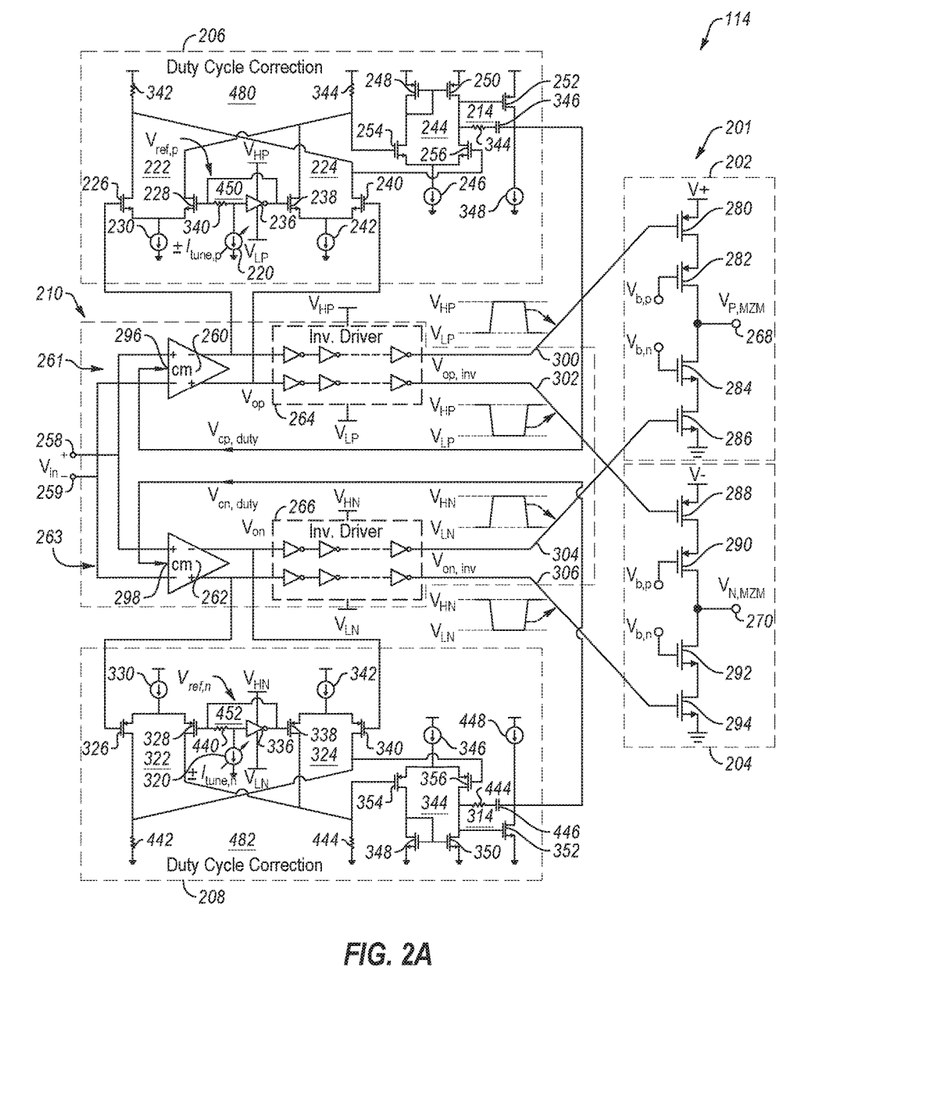
FIG. 2A illustrates an example driver that may be implemented in the communication module of FIG. 1.

FIG. 2A illustrates an example driver 114 that may be implemented in the communication module 100 of FIG. 1, arranged in accordance with at least one embodiment described herein. In general, the driver 114 may be configured to receive a differential input signal $V_{in}+$ and $V_{in}-$ and convert the differential input signal $V_{in}+$ and $V_{in}-$ to an amplified differential output signal $V_{P,MZM}$ and $V_{N,MZM}$. The amplified differential output signal $V_{P,MZM}$ and $V_{N,MZM}$ may include a voltage swing that is different from a voltage swing of the differential input signal $V_{in}+$ and $V_{in}-$. In particular, the voltage swing of the differential output signal $V_{P,MZM}$ and $V_{N,MZM}$ may be greater than the voltage swing of the differential input signal $V_{in}+$ and $V_{in}-$. In these and other embodiments, a voltage swing of the differential signals may refer to a difference between a voltage that represents a logical low value of data carried by the differential signal and a voltage that presents a logical high value of data carried by the differential signal.

The driver 114 may include first and second input terminals 258 and 259, first and second output terminals 268 and 270, a core circuit 210, output circuit 201, and duty cycle correction circuits 206 and 208. Each of the transistors may include a gate terminal, a source terminal, and a drain terminal. As illustrated in FIG. 2A, the source terminal may be the terminal with the arrow, the gate terminal may be the terminal with the parallel horizontal lines, and the drain terminal may be the other terminal. The core circuit 210 may include a p-amplifier channel 261 and an n-amplifier channel 263.

The p-amplifier channel 261 may include a first differential common mode amplifier 260 including differential inputs respectively coupled to first and second input terminals 258 and 259 and a first common mode input 296 for providing the first common mode input signal $V_{cp,duty}$ to the first differential common mode amplifier 260. The first differential common mode amplifier 260 may further include first differential outputs for providing first differential output signals $V_{op}-$ and $V_{op}+$. The p-amplifier channel 261 may further include a first inverter driver 264. The first inverter driver 264 may include differential inputs respectively coupled to the differential outputs of first differential common mode amplifier 260. The first inverter driver 264 may further include first differential driver outputs $V_{op,inv}-$ 300 and $V_{op,inv}+$ 302. The first inverter driver 264 may be further configured to operate using supply voltages $V_{HP}$ and $V_{LP}$.

The n-amplifier channel 263 may include a second differential common mode amplifier 262 including differential inputs respectively coupled to first and second input terminals 258 and 259 and a second common mode input 298 for providing the second common mode input signal $V_{cn,duty}$ to the second differential common mode amplifier 262. The second common mode amplifier 262 may further include second differential outputs for providing second differential output signals $V_{on}-$ and $V_{on}+$. The n-amplifier channel 263 may further include a second inverter driver 266. The second inverter driver 266 may include differential inputs respectively coupled to the differential outputs of second differential common mode amplifier 262. The second inverter driver 266 may further include second differential driver outputs $V_{on,inv}-$ 304 and $V_{on,inv}+$ 306. The second inverter driver 266 may be further configured to operate using supply voltages $V_{HN}$ and $V_{LN}$.

The output circuit 201 includes a first output amplifier 202 and a second output amplifier 204. The first output amplifier 202 couples to the first inverter driver 264 and amplifies signals received on the differential outputs 300 and 302 into an amplified differential output signal $V_{P,MZM}$ generated at the first output terminal 268. The signals received on the first differential driver outputs 300 and 302 swing between a voltage range of $V_{HP}$ and $V_{LP}$.

The first output amplifier 202 includes at least a first p-channel transistor 280, a second p-channel transistor 282, a first n-channel transistor 284, and a second n-channel transistor 286. The first p-channel transistor 280 includes a source coupled to an output voltage source V+, and a drain coupled to a source of the second p-channel transistor 282. The first p-channel transistor 280 may further include a gate coupled to the differential driver outputs 300. The second p-channel transistor 282 may further include a drain coupled to the first output terminal 268 and a gate coupled to a first output circuit bias voltage $V_{b,p}$.

The first n-channel transistor 284 includes a drain coupled to both the drain of the second p-channel transistor 282 and the first output terminal 268. The first n-channel transistor 284 further includes a source coupled to a drain of the second n-channel transistor 286 and a gate coupled to a second output circuit bias voltage $V_{b,n}$. The second n-channel transistor 286 may include a drain coupled to the source of the first n-channel transistor 284 and a source coupled to a ground reference. The second n-channel transistor 286 may further include a gate coupled to the second differential driver output 304.

The second output amplifier 204 couples to the second inverter driver 266 and amplifies signals received on the second differential driver outputs 304 and 306 into the amplified differential output signal $V_{N,MZM}$ generated at the second output terminal 270. The signals received on the second differential driver outputs 304 and 306 swing between a voltage range of $V_{HN}$ and $V_{LN}$.

The second output amplifier 204 includes at least a third p-channel transistor 288, a fourth p-channel transistor 290, a third n-channel transistor 292, and a fourth n-channel transistor 294. The third p-channel transistor 288 includes a source coupled to an output voltage source V−, and a drain coupled to a source of the fourth p-channel transistor 290. The third p-channel transistor 288 may further include a gate coupled to the first differential driver output 302. The fourth p-channel transistor 290 may further include a drain coupled to the second output terminal 270 and a gate coupled to the first output circuit bias voltage $V_{b,p}$.

The third n-channel transistor 292 includes a drain coupled to both the drain of fourth p-channel transistor 290 and the second output terminal 270. The third n-channel transistor 292 further includes a source coupled to a drain of the fourth n-channel transistor 294 and a gate coupled to a second output circuit bias voltage $V_{b,n}$. The fourth n-channel transistor 294 may include a drain coupled to the source of the third n-channel transistor 292 and a source coupled to a ground reference. The fourth n-channel transistor 294 may further include a gate coupled to the second differential driver output 306.

An example operation of the core circuit 210 and the output circuit 201 of driver 114 generating the amplified differential output signal $V_{P,MZM}$ and $V_{N,MZM}$ follows. The differential input signals $V_{in}+$ and $V_{in}-$ respectively at input terminals 258 and 259 each couple to both the p-amplifier channel 261 and the n-amplifier channel 263. The differential input signals $V_{in}+$ and $V_{in}-$ cause first differential common mode amplifier 260 to generate first differential output signals $V_{op}-$ and $V_{op}+$ and second differential common mode amplifier 262 to generate second differential output signals $V_{on}-$ and $V_{on}+$. The differential output signals $V_{op}-$ and $V_{op}+$ and $V_{on}-$ and $V_{on}+$ respectively couple to the first inverter driver 264 and the second inverter driver 266. The inverter drivers 264 and 266 may each include one or more series-configured inverters of increasingly larger drive capability and respectively generate first differential driver output signals $V_{op,inv}$ and second differential driver output signal $V_{on,inv}$. As stated, the first differential driver output signal $V_{op,inv}$ may swing between $V_{HP}$ and $V_{LP}$ while the second differential driver output signal $V_{on,inv}$ may swing between $V_{HN}$ and $V_{LN}$. The first differential driver output signal $V_{op,inv}-$ 300 may drive the gate of first p-channel transistor 280 and the first differential driver output signal $V_{op,inv}+$ 302 may drive the gate of third p-channel transistor 288 in the output circuit 201. The second differential driver output signal $V_{on,inv}-$ 304 may drive the gate of second n-channel transistor 286 and the second differential driver output signal $V_{on,inv}+$ 306 may drive the gate of fourth n-channel transistor 294 in the output circuit 201. Driving the output circuit 201 with the first differential driver output signal $V_{op,inv}$ and the second differential driver output signal $V_{op,inv}$ may generate the amplified differential output signal $V_{P,MZM}$ at the first output terminal 268 and the amplified differential output signal $V_{N,MZM}$ at the second output terminal 270. The amplified differential output signal $V_{P,MZM}$ and $V_{N,MZM}$ may then drive the transmitter 118 of FIG. 1.

Figure 3:
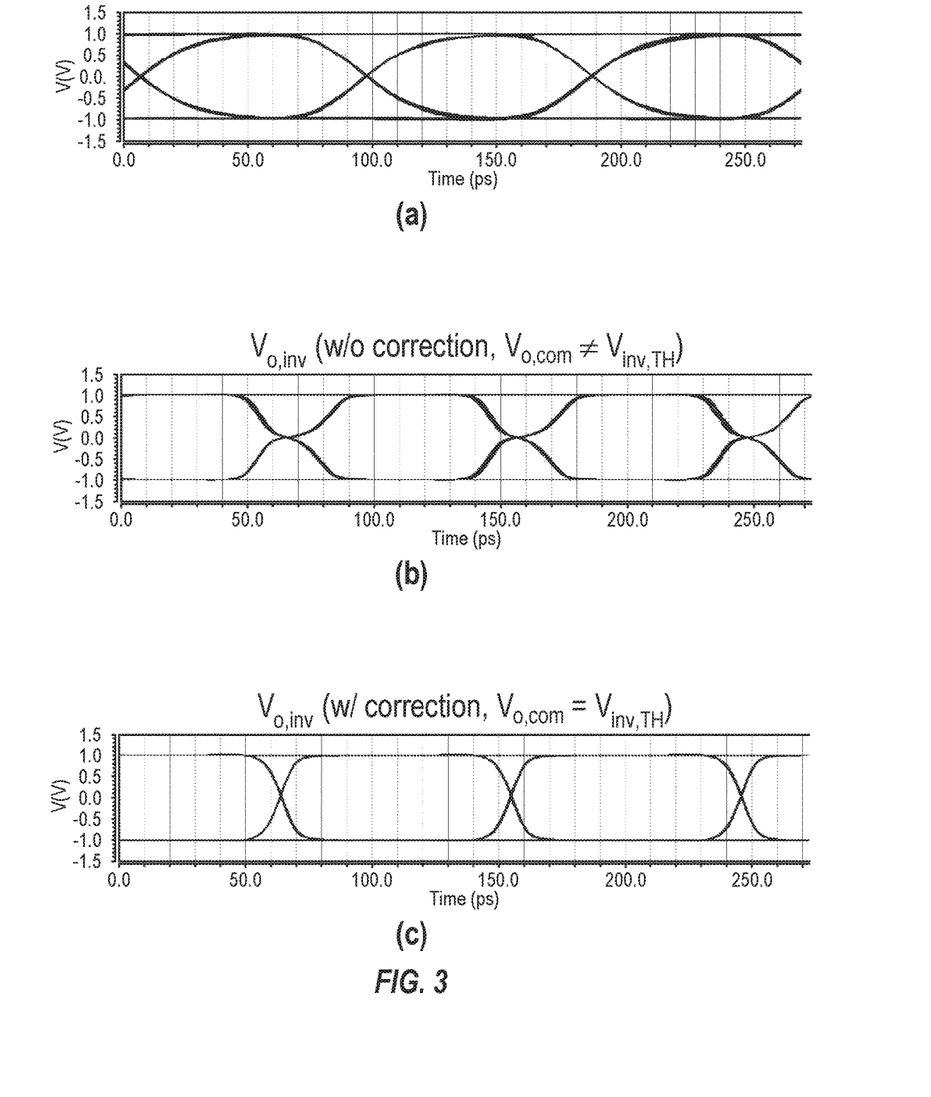
FIG. 3 illustrates a plot of various differential signals, in accordance with various embodiments described herein.

FIG. 3 illustrates a plot of various differential signals, in accordance with various embodiments described herein. In FIG. 3, plot (a) illustrates a plot of the differential output signals Vo representative of either plots of the differential output signal $V_{op}$ at the output of the first differential common mode amplifier 260 or the differential output signal $V_{on}$ at the output of the second differential common mode amplifier 262. The plot (a) illustrates an acceptable duty cycle of the differential signal and an acceptable "eye" for transmission and reception. In order to increase the signal level of the differential signal $V_{on}$ and $V_{op}$ to a level sufficient to drive a transmitter, such as transmitter 118 of FIG. 1, the differential signal $V_{on}$ and $V_{op}$ are coupled to respective inverter drivers 264 and 266. In FIG. 3, a plot (b) illustrates the differential driver output signals $V_{o,inv}$ representative of either plots of the differential driver output signal $V_{op,inv}$ at the output of the first inverter driver 264 or the differential driver output signal $V_{on,inv}$ at the output of the second inverter driver 266. The plot (b) illustrates distortion of the differential driver output signal including the "eye" for transmission and reception. Accordingly, the differential driver output signal of the inverter driver exhibits distortion of the duty cycle.

Returning to FIG. 2A, the driver 114 further includes the duty cycle correction circuits 206 and 208. The first duty cycle correction circuit 206 provides a first common mode input signal $V_{cp,duty}$ at the first common mode input 296 of the first differential common mode amplifier 260. The first duty cycle correction circuit 206 includes a first tunable voltage reference 450 configured to generate a first reference voltage $V_{ref,p}$. The first tunable voltage reference 450 may include a first matched inverter 236, a first reference resistor 340, and a first programmable current source 220.

The first matched inverter 236 may be configured as an inverter matched (i.e., an inverter formed according to a similar process exhibiting similar threshold voltage) to the inverters in the first inverter driver 264. The first matched inverter 236 generates on an output the first reference voltage $V_{ref,p}$ which couples to an input of the first matched inverter 236 via the first reference resistor 340. The input of the first matched inverter 236 is further coupled to the first programmable current source 220. The first programmable current source 220 may be programmable by the control module 120 of FIG. 1 to source a current $\pm I_{tune,p}$.

The first duty cycle correction circuit 206 may further include a first comparison circuit 480 including a first differential amplifier 222 and a second differential amplifier 224. The first differential amplifier 222 may include a first transistor 226 and a second transistor 228. A source of the first transistor 226 and a source of the second transistor 228 may be coupled to a first constant current source 230. A drain of the first transistor 226 may be coupled to a voltage source via a first resistor 342. A drain of the second transistor 228 may be coupled to the voltage source via a second resistor 344. A gate of the first transistor 226 may be coupled to the first differential output signal $V_{op}-$ of the first differential common mode amplifier 260. A gate of the second transistor 228 may be coupled at the output of the first matched inverter 236 to receive the first reference voltage $V_{ref,p}$.

The first duty cycle correction circuit 206 may further include the second differential amplifier 224 including a third transistor 240 and a fourth transistor 238. A source of the third transistor 240 and a source of the fourth transistor 238 may be coupled to a second constant current source 242.

A drain of the third transistor 240 is coupled to the voltage source via the first resistor 342. A drain of the fourth transistor 238 may be coupled to the voltage source via the second resistor 344. A gate of the third transistor 240 may be coupled to the first differential output signal $V_{op}+$ of the first differential common mode amplifier 260. A gate of the second transistor 228 may be coupled at the output of the first matched inverter 236 to receive the first reference voltage $V_{ref,p}$.

The first duty cycle correction circuit 206 may further include a third differential amplifier 244. The third differential amplifier 244 may include a first transistor 248 and a second transistor 250 configured in a current mirror arrangement. The third differential amplifier 244 further includes a third transistor 254 and a fourth transistor 256. A source of the third transistor 254 and a source of the fourth transistor 256 may be coupled to a constant current source 246. A gate of the third transistor 254 may be coupled to the drain of the second transistor 228 of the first differential amplifier 222 and the drain of the fourth transistor 238 of the second differential amplifier 224. A gate of the fourth transistor 256 may be coupled to the drain of the first transistor 226 of the first differential amplifier 222 and the drain of the third transistor 240 of the second differential amplifier 224.

The first duty cycle correction circuit 206 further includes a first stabilizing circuit 214 coupled to the third differential amplifier 244. The first stabilizing circuit 214 may include a transistor 252 coupled at a source to the voltage source and at a drain to a constant current source 348. A gate of the transistor 252 may be coupled to the drain of second transistor 250, the drain of the fourth transistor 256, and to the constant current source 348 via a resistor 344 and a capacitor 346. The drain of transistor 252 may be further coupled to the first common mode input 296 to provide the first common mode input signal $V_{cp,duty}$ to the first differential common mode amplifier 260. The resistor 344 and the capacitor 346 create a time-constant to provide stabilization to the first common mode input signal $V_{cp,duty}$ at the first common mode input 296 of the first differential common mode amplifier 260.

The second duty cycle correction circuit 208 provides a second common mode input signal $V_{cn,duty}$ at the second common mode input 298 of the second differential common mode amplifier 262. The second duty cycle correction circuit 208 includes a second tunable voltage reference 452 configured to generate a second reference voltage $V_{ref,n}$. The second tunable voltage reference 452 may include a second matched inverter 336, a second reference resistor 440, and a second programmable current source 320.

The second matched inverter 336 may be configured as an inverter matched (i.e., an inverter formed according to a similar process exhibiting similar threshold voltage) to the inverters in the second inverter driver 266. The second matched inverter 336 generates on an output the second reference voltage $V_{ref,n}$ which couples to an input of the second matched inverter 336 via the second reference resistor 440. The input of the second matched inverter 336 is further coupled to the second programmable current source 320. The second programmable current source 320 may be programmable by the control module 120 of FIG. 1 to source a current $\pm I_{tune,n}$.

The second duty cycle correction circuit 208 may further include a second comparison circuit 482 including a first differential amplifier 322 and a second differential amplifier 324. The first differential amplifier 322 may include a first transistor 326 and a second transistor 328. A source of the first transistor 326 and a source of the second transistor 328 may be coupled to a first constant current source 330. A drain of the first transistor 326 may be coupled to a voltage source via a first resistor 442. A drain of the second transistor 328 may be coupled to the voltage source via a second resistor 444. A gate of the first transistor 326 may be coupled to the second differential output signal $V_{on}+$ of the second differential common mode amplifier 262. A gate of the second transistor 328 may be coupled at the output of the second matched inverter 336 to receive the second reference voltage $V_{ref,n}$.

The second duty cycle correction stage 208 may further include the second differential amplifier 324 including a third transistor 340 and a fourth transistor 338. A source of the third transistor 340 and a source of the fourth transistor 338 may be coupled to a second constant current source 342. A drain of the third transistor 340 is coupled to the voltage source via the first resistor 442. A drain of the fourth transistor 338 may be coupled to the voltage source via the second resistor 444. A gate of the third transistor 340 may be coupled to the second differential output signal $V_{on}-$ of the second differential common mode amplifier 262. A gate of the second transistor 328 may be coupled at the output of the second matched inverter 336 to receive the second reference voltage $V_{ref,n}$.

The second duty cycle correction circuit 208 may further include a third differential amplifier 344. The third differential amplifier 344 may include a first transistor 348 and a second transistor 350 configured in a current mirror arrangement. The third differential amplifier 344 further includes a third transistor 354 and a fourth transistor 356. A source of the third transistor 354 and a source of the fourth transistor 356 may be coupled to a constant current source 346. A gate of the third transistor 354 may be coupled to the drain of the second transistor 328 of the first differential amplifier 322 and the drain of the fourth transistor 338 of the second differential amplifier 324. A gate of the fourth transistor 356 may be coupled to the drain of the first transistor 326 of the first differential amplifier 322 and the drain of the third transistor 340 of the second differential amplifier 324.

The second duty cycle correction circuit 208 further includes a second stabilizing circuit 314 coupled to the third differential amplifier 344. The second stabilizing circuit 314 may include a transistor 352 coupled at a source to the voltage source and at a drain to a constant current source 448. A gate of the transistor 352 may be coupled to the drain of the second transistor 350, the drain of the fourth transistor 356, and to the constant current source 448 via a resistor 444 and a capacitor 446. The drain of transistor 352 may be further coupled to the second common mode input 298 to provide the second common mode input signal $V_{cn,duty}$ to the second differential common mode amplifier 262. The resistor 444 and the capacitor 446 create a time-constant to provide stabilization to the second common mode input signal $V_{cn,duty}$ at the second common mode input 298 of the second differential common mode amplifier 262.

Figure 2B:
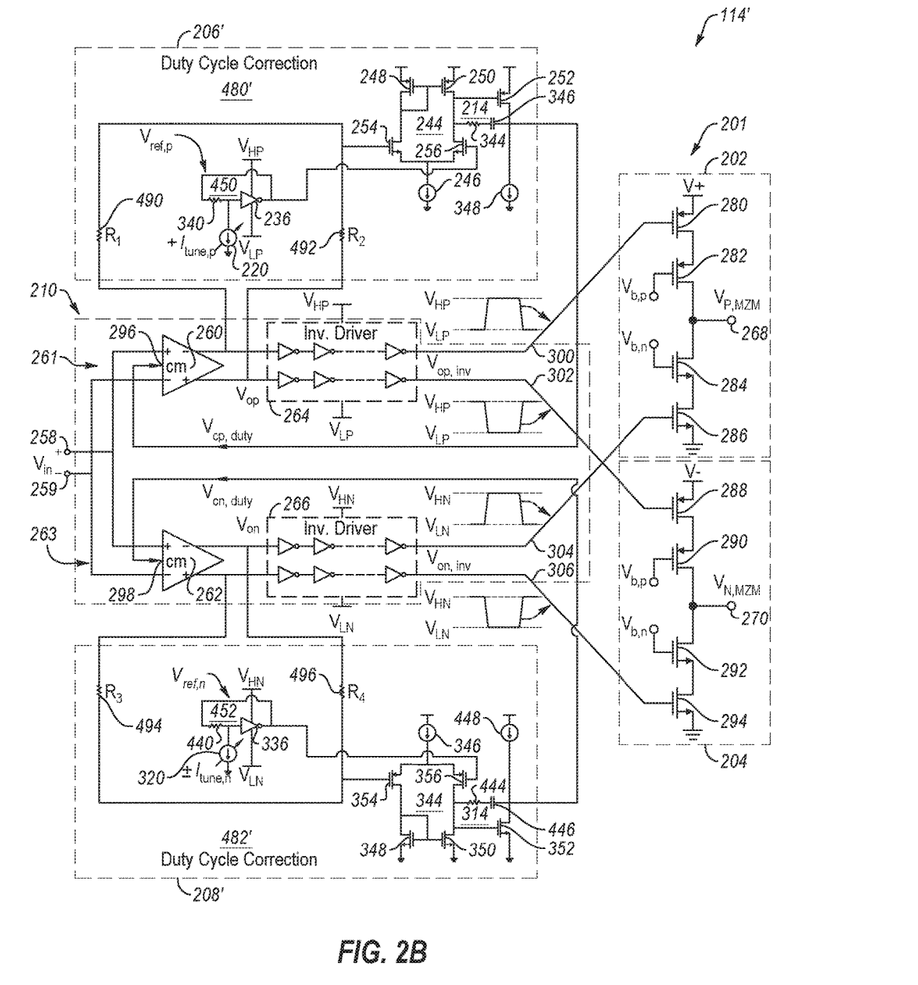
FIG. 2B illustrates another example driver that may be implemented in the communication module of FIG. 1.

FIG. 2B illustrates another example driver 114' that may be implemented in the communication module 100 of FIG. 1, arranged in accordance with at least another embodiment described herein. The driver 114' provides an alternative configuration to the embodiment described in FIG. 2A by providing resistors for common mode sensing instead of CMOS transistors. Such a tradeoff may reduce the loop gain. With regard to FIG. 2B, only the differences from FIG. 2A will be further described with respect to FIG. 2B.

Regarding FIG. 2B, the driver 114' further includes the duty cycle correction circuits 206' and 208'. The first duty cycle correction circuit 206' provides a first common mode input signal $V_{cp,duty}$ at the first common mode input 296 of the first differential common mode amplifier 260'. The first duty cycle correction circuit 206' includes a first tunable voltage reference 450 configured to generate a first reference voltage $V_{ref,p}$. The first tunable voltage reference 450 may include a first matched inverter 236, a first reference resistor 340, and a first programmable current source 220.

The first matched inverter 236 may be configured as an inverter matched (i.e., an inverter formed according to a similar process exhibiting similar threshold voltage) to the inverters in the first inverter driver 264. The first matched inverter 236 generates on an output the first reference voltage $V_{ref,p}$ which couples to an input of the first matched inverter 236 via the first reference resistor 340. The input of the first matched inverter 236 is further coupled to the first programmable current source 220. The first programmable current source 220 may be programmable by the control module 120 of FIG. 1 to source a current $\pm I_{tune,p}$.

The first duty cycle correction circuit 206 may further include a first comparison circuit 480' including a first resistor $R_1$ 490 and a second resistor $R_2$ 492. A first terminal of resistor $R_1$ 490 may be coupled to the gate of third transistor 254 and a second terminal of resistor $R_1$ 490 may be coupled to the first differential output signal $V_{op}-$ of the first differential common mode amplifier 260. A first terminal of resistor $R_2$ 492 may be coupled to the gate of third transistor 254 and a second terminal of resistor $R_2$ 492 may be coupled to the second differential output signal $V_{op}+$ of the first differential common mode amplifier 260.

The first duty cycle correction circuit 206' may further include a third differential amplifier 244. The third differential amplifier 244 may include a first transistor 248 and a second transistor 250 configured in a current mirror arrangement. The third differential amplifier 244 further includes a third transistor 254 and a fourth transistor 256. A source of the third transistor 254 and a source of the fourth transistor 256 may be coupled to a constant current source 246.

The first duty cycle correction circuit 206' further includes a first stabilizing circuit 214 coupled to the third differential amplifier 244. The first stabilizing circuit 214 may include a transistor 252 coupled at a source to the voltage source and at a drain to a constant current source 348. A gate of the transistor 252 may be coupled to the drain of second transistor 250, the drain of the fourth transistor 256, and to the constant current source 348 via a resistor 344 and a capacitor 346. The drain of transistor 252 may be further coupled to the first common mode input 296 to provide the first common mode input signal $V_{cp,duty}$ to the first differential common mode amplifier 260. The resistor 344 and the capacitor 346 create a time-constant to provide stabilization to the first common mode input signal $V_{cp,duty}$ at the first common mode input 296 of the first differential common mode amplifier 260.

The second duty cycle correction circuit 208' provides a second common mode input signal $V_{cn,duty}$ at the second common mode input 298 of the second differential common mode amplifier 262. The second duty cycle correction circuit 208' includes a second tunable voltage reference 452 configured to generate a second reference voltage $V_{ref,n}$. The second tunable voltage reference 452 may include a second matched inverter 336, a second reference resistor 440, and a second programmable current source 320.

The second matched inverter 336 may be configured as an inverter matched (i.e., an inverter formed according to a similar process exhibiting similar threshold voltage) to the inverters in the second inverter driver 266. The second matched inverter 336 generates on an output the second reference voltage $V_{ref,n}$ which couples to an input of the second matched inverter 336 via the second reference resistor 440. The input of the second matched inverter 336 is further coupled to the second programmable current source 320. The second programmable current source 320 may be programmable by the control module 120 of FIG. 1 to source a current $\pm I_{tune,n}$.

The second duty cycle correction circuit 208' may further include a second comparison circuit 482' including a third resistor $R_3$ 494 and a fourth resistor $R_4$ 496. A first terminal of resistor $R_3$ 494 may be coupled to the gate of third transistor 354 and a second terminal of resistor $R_3$ 494 may be coupled to the second differential output signal $V_{on}+$ of the second differential common mode amplifier 262. A first terminal of resistor $R_4$ 496 may be coupled to the gate of third transistor 354 and a second terminal of resistor $R_4$ 496 may be coupled to the second differential output signal $V_{on}-$ of the second differential common mode amplifier 262.

The second duty cycle correction circuit 208 may further include a third differential amplifier 344. The third differential amplifier 344 may include a first transistor 348 and a second transistor 350 configured in a current mirror arrangement. The third differential amplifier 344 further includes a third transistor 354 and a fourth transistor 356. A source of the third transistor 354 and a source of the fourth transistor 356 may be coupled to a constant current source 346.

The second duty cycle correction circuit 208' further includes a second stabilizing circuit 314 coupled to the third differential amplifier 344. The second stabilizing circuit 314 may include a transistor 352 coupled at a source to the voltage source and at a drain to a constant current source 448. A gate of the transistor 352 may be coupled to the drain of second transistor 350, the drain of the fourth transistor 356, and to the constant current source 448 via a resistor 444 and a capacitor 446. The drain of transistor 352 may be further coupled to the second common mode input 298 to provide the second common mode input signal $V_{cn,duty}$ to the second differential common mode amplifier 262. The resistor 444 and the capacitor 446 create a time-constant to provide stabilization to the second common mode input signal $V_{cn,duty}$ at the second common mode input 298 of the second differential common mode amplifier 262.

In operation, the drivers 114 and 114' may correct the duty cycle of high speed/low voltage CMOS inverters, such as inverter drivers 264 and 266, that drive a high voltage output stage, such as output circuit 201. The output circuit, in turn, may drive a high speed/high voltage Mach Zehnder Modulator (MZM) or Laser device, such as transmitter 118 of FIG. 1, for electrical to optical data conversion in high speed optical communication.

By way of example, high speed CMOS devices in a certain technology may be low voltage due to different device trade-offs such as thinner gate oxide, smaller channel-length and higher doping concentration in the diffusion regions. In order to utilize the speed advantage of these types of devices while avoiding reliability issues in high voltage applications, the rail-to-rail swing of the inverter drivers 264 and 266 composed of such devices may intentionally be made limited within their reliability limit while maintaining the high voltage swing at the output ($V_{P,MZM}$ and $V_{N,MZM}$ in FIGS. 2A and 2B).

The inverters (such as those in the inverter driver) typically require a certain voltage at the input for the output to switch from high to low voltage and vice-versa. Known as the inverter threshold voltage, $V_{inv,TH}$, this voltage heavily depends on the inverter supply rails ($V_{HP}$ to $V_{LP}$ and $V_{HN}$ to $V_{LN}$ in FIGS. 2A and 2B) and may also vary depending on process, temperature and mismatch conditions of the circuit. Any deviation of the input common mode voltage from $V_{inv}$, $T_H$ may cause duty cycle distortion at the inverter outputs ($V_{op,inv}$ and $V_{on,inv}$ in FIGS. 2A and 2B) irrespective of the duty cycle at the differential output signals ($V_{op}$ and $V_{on}$ in FIGS. 2A and 2B). Therefore, even if the duty cycle is perfect at the inputs, the outputs of the inverter driver will still suffer from duty cycle distortion unless the inverter input common mode is closer to $V_{inv,TH}$.

Accordingly, the above-disclosed system brings the input common mode voltage of the inverters closer to $V_{inv,TH}$ and therefore fixing the output duty cycle of the inverter drivers at ~50%. The matched inverter connected in transimpedance (TIA) configuration creates a reference voltage ($V_{ref,p}$ and $V_{ref,n}$ in FIGS. 2A and 2B) that is nominally equal to the respective inverter threshold voltage ($V_{inv,TH}$) when the tuning currents ($I_{tune,p}$ and $I_{tune,n}$ in FIGS. 2A and 2B) are equal to zero. In the presence of circuit mismatches, the generated reference voltages may differ slightly from the inverter threshold voltage and can easily be fixed by controlling the tuning currents ($I_{tune,p}$ and $I_{tune,n}$ in FIGS. 2A and 2B). The differential-to-single ended amplifier configuration of the duty cycle control circuitry as shown in FIGS. 2A and 2B senses the differential output signals $V_{op}$ and $V_{on}$ to determine the input common mode voltages of the inverter drivers, compares the common mode voltages with the generated reference voltages $V_{ref,p}$ and $V_{ref,n}$ and re-tunes the preceding differential stages to reduce the difference between the reference voltage and the input common mode voltage. Given that the loop gain of this common mode control loop is high, the difference becomes negligible, yielding a ~50% duty cycle at the output of the inverter drivers.

FIG. 3 at plot (c) illustrates the improvement to the output signal $V_{o,inv}$ which drives the high-power output circuit 201. As noted in a comparison of plot (b) without the common mode correction provided by the duty cycle correction circuits 206 and 208, plot (c) provides an improvement to the "eye" opening and the duty cycle of the output signal $V_{o,inv}$ which drives the high-power output circuit 201.

Figure 4:
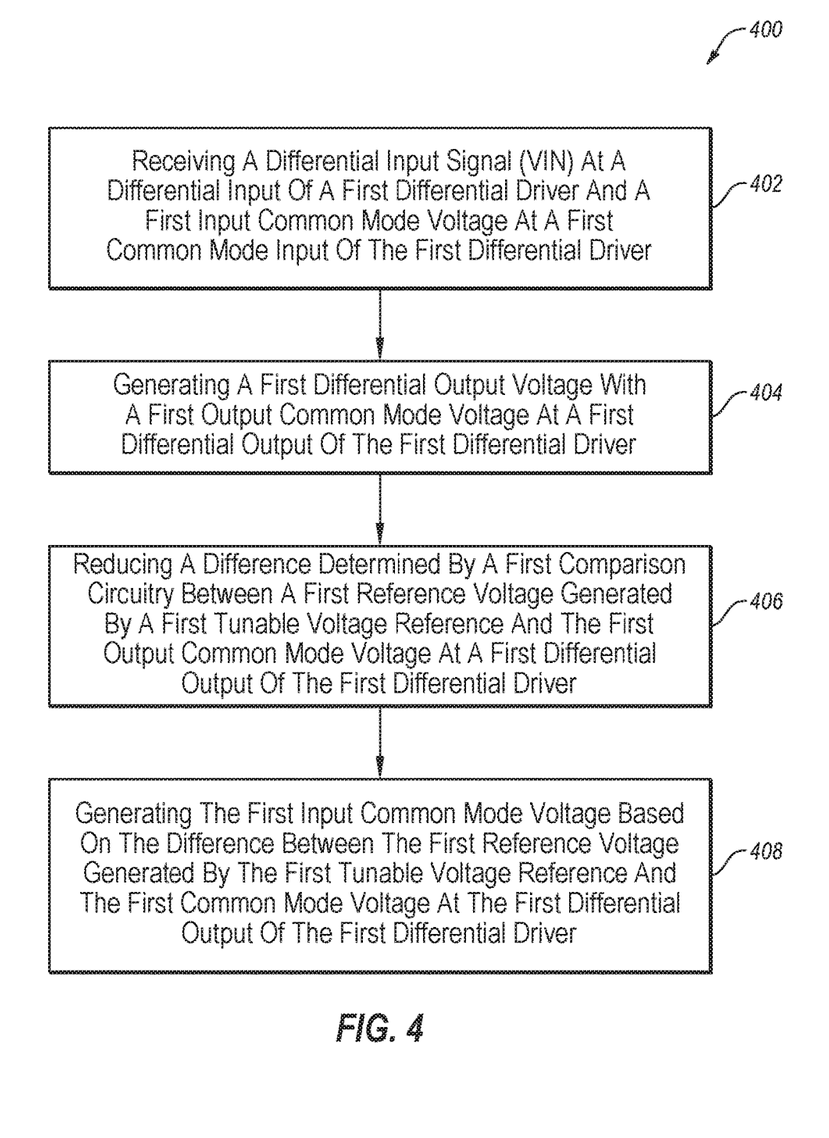
FIG. 4 is a flowchart of an example method of correcting the duty cycle of inverter drivers in an integrated circuit, arranged in accordance with at least one embodiment described herein.

FIG. 4 is a flow chart of an example method 400 of correcting the duty cycle of inverter drivers in an integrated circuit, arranged in accordance with at least some embodiments described herein. The method 400 may be implemented, in some embodiments, by a driver, such as the driver 114 of FIG. 1 or FIGS. 2A and 2B. Although illustrated as discrete blocks, various blocks may be divided into additional blocks, combined into fewer blocks, or eliminated, depending on the desired implementation.

The method 400 may begin at block 402 where a differential input signal (Vin) at a differential input of a first differential driver may be received and a first input common mode voltage at a first common mode input of the first differential driver may also be received. In some embodiments, the differential input signal may be concurrently received at a second differential driver and a second input common mode voltage may also be concurrently received at a second common mode input.

In block 404, a first differential output voltage may be generated with a first output common mode voltage at a first differential output of the first differential driver. In some embodiments, a second differential output voltage may also be concurrently generated with a second output common mode voltage at a second differential output of the second differential driver.

In block 406, a first difference determined by a first comparison circuitry between a first reference voltage generated by a first tunable voltage reference and the first output common mode voltage at a first differential output of the first differential driver may be reduced. In some embodiments, a second difference determined by a second comparison circuitry between a second reference voltage generated by a second tunable voltage reference and the second output common mode voltage at a second differential output of the second driver may also be reduced.

In a block 408, the first input common mode voltage based on the first difference between the first reference voltage generated by the first tunable voltage reference and the first common mode voltage at the first differential output of the first differential driver may be generated. In some embodiments, the second input common mode voltage based on the second difference between the second reference voltage generated by the second tunable voltage reference and the second common mode voltage at the second differential output of the second differential driver may also be generated.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present invention may be embodied in other specific forms without departing from its spirit or essential characteristics. The described implementations are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A driver circuit, comprising:
   a first differential driver including differential inputs to receive a differential input signal and a first common mode input to receive a first input common mode voltage and a first differential output to output a first differential output voltage with a first output common mode voltage; and
   a first duty cycle correction circuit including a first tunable voltage reference and a first comparison circuitry configured to generate the first input common mode voltage based on reducing a difference determined by the first comparison circuitry between a first reference voltage generated by the first tunable voltage reference and the first output common mode voltage at the first differential output of the first differential driver.

2. The driver circuit of claim 1, wherein the first comparison circuitry includes:
   a first differential amplifier configured to generate first differential duty cycle correction output signal based on a first one of the first differential output from the first differential driver and the first reference voltage from the first tunable voltage reference;
   a second differential amplifier configured to generate second differential duty cycle correction output signal based on a second one of the first differential output from the first differential driver and the first reference voltage from the first tunable voltage reference; and
   a third differential amplifier configured to generate the first input common mode voltage based on the first differential duty cycle correction output signal of the first differential amplifier and the second differential duty cycle correction output signal of the second differential amplifier.

3. The driver circuit of claim 1, wherein the first comparison circuitry includes:
a first resistor configured to generate a first differential duty cycle correction output signal based on the first one of the first differential output from the first differential driver; and
a second resistor configured to generate a second differential duty cycle correction output signal based on the second one of the first differential output from the first differential driver.

4. The driver circuit of claim 1, further comprising:
a first inverter driver including a first plurality of series coupled inverters coupled to a first one of the first differential output and a second plurality of series coupled inverters coupled to a second one of the first differential output.

5. The driver circuit of claim 4, wherein the first tunable voltage reference includes an inverter matched to an inverter of one of the first and second series coupled inverters of the first inverter driver.

6. The driver circuit of claim 1, further comprising:
a second differential driver including differential inputs to receive a differential input signal and a second common mode input to receive a second input common mode voltage and a second differential output to output a second differential output voltage with a second output common mode voltage; and
a second duty cycle correction circuit including a second tunable voltage reference and a second comparison circuitry configured to generate the second input common mode voltage based on reducing a difference determined by the second comparison circuitry between a second reference voltage generated by the second tunable voltage reference and the second output common mode voltage at the first differential output of the second differential driver.

7. The driver circuit of claim 6, wherein the second comparison circuitry includes:
a fourth differential amplifier configured to generate a fourth differential output based on a first one of the second differential output from the second differential driver and the second reference voltage from the second tunable voltage reference;
a fifth differential amplifier configured to generate a fifth differential output based on a second one of the second differential output from the second differential driver and the second reference voltage from the second tunable voltage reference; and
a sixth differential amplifier configured to generate the second input common mode voltage based on the fourth differential outputs of the fourth differential amplifier and the fifth differential outputs of the fifth differential amplifier.

8. The driver circuit of claim 6, wherein the second comparison circuitry includes:
a third resistor configured to generate a third differential duty cycle correction output signal based on the first one of the second differential output from the second differential driver; and
a fourth resistor configured to generate a fourth differential duty cycle correction output signal based on the second one of the second differential output from the second differential driver.

9. The driver circuit of claim 6, further comprising:
a second inverter driver including a third plurality of series coupled inverters coupled to a first one of the second differential output and a fourth plurality of series coupled inverters coupled to a second one of the second differential output.

10. The driver circuit of claim 9, wherein the second tunable voltage reference includes an inverter matched to an inverter of one of the third and fourth series coupled inverters of the second inverter driver.

11. The driver circuit of claim 6, further comprising:
an output stage to amplify the differential input signal into an amplified differential output signal based on the first differential output voltage and the second differential output voltage.

12. A method, comprising:
receiving a differential input signal at a differential input of a first differential driver and a first input common mode voltage at a first common mode input of the first differential driver;
generating a first differential output voltage with a first output common mode voltage at a first differential output of the first differential driver;
reducing a first difference determined by a first comparison circuitry between a first reference voltage generated by a first tunable voltage reference and the first output common mode voltage at the first differential output of the first differential driver; and
generating the first input common mode voltage based on the first difference between the first reference voltage generated by the first tunable voltage reference and the first input common mode voltage at the first differential output of the first differential driver.

13. The method of claim 12, wherein generating the first input common mode voltage includes:
generating a first differential duty cycle correction output signal based on a first one of the first differential output from the first differential driver and the first reference voltage from the first tunable voltage reference;
generating a second differential duty cycle correction output signal based on a second one of the first differential output from the first differential driver and the first reference voltage from the first tunable voltage reference; and
generating the first input common mode voltage based on the first differential duty cycle correction output signal of a first differential amplifier and the second differential duty cycle output signal of a second differential amplifier.

14. The method of claim 13, further comprising matching an inverter in the first tunable voltage reference with an inverter in a first inverter driver coupled to the first differential output.

15. The method of claim 12, further comprising:
receiving the differential input signal at a differential input of a second differential driver and a second input common mode voltage at a second common mode input of the second differential driver;
generating a second differential output voltage with a second output common mode voltage at a second differential output of the second differential driver;
reducing a second difference determined by a second comparison circuitry between a second reference voltage generated by a second tunable voltage reference and the second output common mode voltage at the second differential output of the second differential driver; and generating the second input common mode voltage based on the second difference between the second reference voltage generated by the second tunable voltage reference and the second input common mode voltage at the second differential output of the second differential driver.

16. The method of claim 15, wherein generating the second input common mode voltage includes:
generating a third differential duty cycle correction output signal based on a first one of the second differential output signal from the second differential driver and the second reference voltage from the second tunable voltage reference;
generating a fourth differential duty cycle correction output signal based on a second one of the first differential output from the second differential driver and the second reference voltage from the second tunable voltage reference; and
generating the second input common mode voltage based on the third differential duty cycle correction output signal of a third differential amplifier and the fourth differential duty cycle output signals of a fourth differential amplifier.

17. The method of claim 16, further comprising:
amplifying the differential input signal into an amplified differential output signal based on the first differential output voltage and the second differential output voltage.

18. The method of claim 15, further comprising matching an inverter in the second tunable voltage reference with an inverter in a second inverter driver coupled to the second differential output.

19. A driver circuit, comprising:
a first differential driver including differential inputs to receive a differential input signal and a first common mode input to receive a first input common mode voltage and a first differential output to output a first differential output voltage with a first output common mode voltage;
a first duty cycle correction circuit including a first tunable voltage reference and a first comparison circuitry configured to generate the first input common mode voltage based on reducing a difference determined by the first comparison circuitry between a first reference voltage generated by the first tunable voltage reference and the first output common mode voltage at the first differential output of the first differential driver;
a second differential driver including differential inputs to receive a differential input signal and a second common mode input to receive a second input common mode voltage and a second differential output to output a second differential output voltage with a second output common mode voltage; and
a second duty cycle correction circuit including a second tunable voltage reference and a second comparison circuitry configured to generate the second input common mode voltage based on reducing a difference determined by the second comparison circuitry between a second reference voltage generated by the second tunable voltage reference and the second output common mode voltage at the first differential output of the second differential driver.

20. The driver circuit of claim 19,
wherein the first comparison circuitry includes:
a first differential amplifier configured to generate first differential duty cycle correction output signal based on a first one of the first differential output from the first differential driver and the first reference voltage from the first tunable voltage reference;
a second differential amplifier configured to generate second differential duty cycle correction output signal based on a second one of the first differential output from the first differential driver and the first reference voltage from the first tunable voltage reference; and
a third differential amplifier configured to generate the first input common mode voltage based on the first differential duty cycle correction output signal of the first differential amplifier and the second differential duty cycle correction output signal of the second differential amplifier; and
wherein the second comparison circuitry includes:
a fourth differential amplifier configured to generate a fourth differential output based on a first one of the second differential output from the second differential driver and the second reference voltage from the second tunable voltage reference;
a fifth differential amplifier configured to generate a fifth differential output based on a second one of the second differential output from the second differential driver and the second reference voltage from the second tunable voltage reference; and
a sixth differential amplifier configured to generate the second input common mode voltage based on the fourth differential outputs of the fourth differential amplifier and the fifth differential outputs of the fifth differential amplifier.

* * * * *